United States Patent [19]

Winter

[11] 4,152,386

[45] May 1, 1979

[54] METHOD FOR THE PRODUCTION OF SUPERCONDUCTORS CONSISTING OF A POLYMER OF GLASS MATRIX WITH FINELY DISPERSED PARTICLES

[75] Inventor: Heinrich Winter, Eschborn, Fed. Rep. of Germany

[73] Assignee: Battelle-Institute e.V., Frankfurt am Main, Fed. Rep. of Germany

[21] Appl. No.: 787,438

[22] Filed: Apr. 14, 1977

[30] Foreign Application Priority Data

Apr. 14, 1976 [DE] Fed. Rep. of Germany ....... 2616394

[51] Int. Cl.$^2$ .............................. B29D 3/02
[52] U.S. Cl. ................. 264/108; 264/176 R; 264/211; 252/512; 252/518; 427/62; 427/205
[58] Field of Search ............ 264/108, 104, 24, 176 R, 264/176 F; 260/42.22; 106/193 M; 252/500, 512, 5; 427/62, 205; 343/911 R

[56] References Cited

U.S. PATENT DOCUMENTS

| | | | |
|---|---|---|---|
| 2,593,943 | 4/1952 | Wainer | 260/42.22 |
| 2,721,357 | 10/1955 | Hochberg | 264/104 |
| 2,761,849 | 9/1956 | Coler | 106/193 M |
| 2,847,710 | 8/1958 | Pitzer | 264/63 |
| 3,015,858 | 1/1962 | Hendricks | 264/108 |
| 3,148,232 | 9/1964 | Scheyer | 264/108 |
| 3,167,525 | 1/1965 | Thomas | 260/42.22 |
| 3,300,329 | 1/1967 | Orsino et al. | 260/42.22 |
| 3,328,501 | 6/1967 | Barnett | 264/108 |
| 3,380,935 | 4/1968 | Ring | 252/512 |
| 3,427,264 | 2/1969 | Forster et al. | 260/42.22 |
| 3,450,510 | 6/1969 | Calows | 264/108 |
| 3,626,041 | 12/1971 | Fields et al. | 264/108 |
| 3,650,991 | 3/1972 | Watson | 252/512 |
| 3,760,495 | 9/1973 | Meger | 264/104 |
| 3,846,345 | 11/1974 | Mason et al. | 252/512 |
| 3,867,315 | 2/1975 | Tigner et al. | 252/512 |
| 3,988,524 | 10/1976 | Dreyer et al. | 260/42.22 |
| 4,013,591 | 3/1977 | Granger et al. | 252/518 |

FOREIGN PATENT DOCUMENTS 2363279  7/1974  Fed. Rep. of Germany ........ 260/42.22

*Primary Examiner*—Jay H. Woo
*Attorney, Agent, or Firm*—Fisher, Christen & Sabol

[57] ABSTRACT

A method is disclosed for the production of superconductors consisting of a polymer or glass matrix which contains a very fine dispersion of superconducting particles, approximately 50 to 100 Å in diameter, of intermetallic compounds of vanadium or niobium with the elements aluminum, germanium, silicon, gallium or tin, or of niobium nitride or niobium carbonitride. The matrix material is first brought into a viscous state and the superconducting particles are admixed with the viscous matrix in such quantities that, after solidification of the matrix, the particles are spaced at an average distance of 10 to 100 Å. The superconducting material may be then formed in wires, filaments and tapes.

18 Claims, No Drawings

METHOD FOR THE PRODUCTION OF SUPERCONDUCTORS CONSISTING OF A POLYMER OF GLASS MATRIX WITH FINELY DISPERSED PARTICLES

FIELD OF THE INVENTION

The invention relates to a method for the production of superconductors consisting of a polymer or glass matrix which contains a very fine dispersion of superconducting particles, about 50 to 1000 Å in diameter, of intermetallic compounds of vanadium or niobium with the elements aluminium, germanium, silicon, gallium or tin, or of niobium nitride or niobium carbonitride.

BRIEF DESCRIPTION OF THE PRIOR ART

Heavy-duty "hard" superconductors of the conventional type with a transition temperature of 15 K or above are without exception extremely brittle substances and thus cannot be transformed into extended conductors, e.g. wires. Therefore, attempts have been reported to incorporate these "hard" superconductors of "the second kind" in the form of small particles into a metallic matrix, e.g. a copper matrix. As a result of the proximity effect, the particles incorporated in the matrix influence their electrically conductive, though non-superconducting, metallic environment such that superconduction-inducing electron pairs with opposite spin, called Cooper pairs, are generated also there, so that ultimately the entire composite system of metal and superconducting particles becomes a superconductor. A prerequisite for this is that the distances between the incorporated superconducting particles do not exceed the "coherence length" $\xi_o$, which may be of the order of $10^3$ Å.

An entirely new method of incorporating superconducting particles into a non-superconducting and electrically non-conductive matrix was found by J. H. P. Watson (Appl. Phys. Lett. 15 (1969) pp. 125–127. He leached pores with a diameter of about 20 to 30 Å into the surfaces of Vycor glasses and filled these under hydrostatic pressure with liquid lead. In this way he obtained lead particles in a glass matrix which had the above diameter and were spaced at a distance only somewhat less than that. Although these particles were separated from each other by the dielectric glass, they showed significantly enhanced superconducting properties. The critical magnetic field for lead was raised by a factor of 200. The soft superconductor of the first kind, i.e. the metal lead, turned into a "hard" superconductor of the second kind.

In the above-cited article J. H. P. Watson further points out that the transition temperature $T_c$ as well can be raised significantly if superconducting particles with a size and a spacing of the order of 10 Å are successfully incorporated into an electrically non-conductive matrix. According to McMillan's theory (Phys. Rev. 167 (1968) p. 331) this will increase the transition temperature from about 10 to 20 K for niobium and from about 17 to 40 K for $V_3Si$. The increase is ascribed to the tunnel effect. The electrons combined into Cooper pairs can tunnel through the distances between the dispersed superconducting particles; it is said to be of advantage if the matrix separating the particles is a non-conductor.

J. H. P. Watson failed in all his involves a number of serious disadvantages. to incorporate into the glass pores "hard" superconductors, such as niobium and intermetallic compounds of niobium or vanadium of $\beta W/A15$ structure, instead of low-melting superconducting metals and alloys, such as lead, lead-40 weight percent bismuth, tin, mercury and indium, and thus to arrive at transition temperatures in the range of the temperature of liquid hydrogen and at critical magnetic fields extending into the megagauss range. Moreover, the technology described in detail by J. H. P. Watson in his U.S. Pat. No. 3,748,728 of July 31, 1973, For example, particles of low-melting superconductors of the first kind can be dispersed only in zones close to the surface of the glass. The greater part of the glass cross section thus cannot be utilised for superconduction. Nor was it possible to prepare ductile thin filaments or tapes as required for superconducting magnetic coils.

Furthermore, attempts have been reported to prepare particles with a size in the $\mu$m-range from "hard" and extremely brittle superconducting materials by grinding in a ball mill (H. R. Khan and Ch. J. Raub, J. Less-Common Metals 43 (1975) pp. 49–54). However, in order to achieve superconductivity by the above-described effect, particles with diameters between 50 and 1000 Å are required. For their preparation E. Neueschwander (E. Neuenschwander. J. Less-Common Metals 11 (1966) pp. 365–375) has proposed a method in which chlorides of niobium together with nitrogen and/or hydrocarbon are injected into a hydrogen plasma where the following reaction takes place:

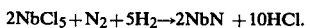

$$2NbCl_5 + N_2 + 5H_2 \rightarrow 2NbN + 10HCl.$$

As a result of this reaction, niobium nitride particles of the required size are precipitated from the reaction zone which has a temperature of about 3000° C. Niobium nitride is a "hard" superconductor with a transition temperature of about 15 K (N. Pesall et al., Appl. Phys. Lett. 7 (1965) pp. 38–39). In the same way niobium carbonitride particles can be prepared by the addition of a hydrocarbon, e.g. $C_2H_2$. $NbC_xN_{1-x}$, with values of x up to 0,5, shows transition temperatures above 17 K (N. Pesall et al., see above).

If, instead of nitrogen and hydrocarbon, chlorides of aluminium, germanium, gallium, silicon or tin, in particular, are introduced into the reaction zone together with chlorides of niobium or vanadium, high-melting "hard" superconductors of the type $A_3B$ (A denoting Nb or V, B for Al, Ge, Ga Si or Sn) with the desired $\beta W/A15$-structure are obtained upon proper dosage.

SUMMARY OF THE INVENTION

The objective of this invention is to exploit the findings outlined above and to incorporate particles of high-melting "hard" superconductors of the second kind into an electrically non-conductive polymer of glass matrix for the purpose of preparing a superconductive material of the above-defined type. This is possible if, as proposed by this invention, the matrix material is brought into a viscous stage and the superconducting particles with diameters between 50 and 1000 Å are admixed to this liquid or solution in such quantities that after solidification of the matrix material the finely dispersed particles are spaced at an average distance of the order of 10 to 100 Å.

Because of their high melting point and their stability the superconducting particles remain unchanged in the molten glass or the dissolved polymer.

The method according to the invention eliminates the necessity of leaching the glass surface and filling the resulting pores with molten metal under hydrostatic pressure. In addition, the whole cross section of the polymer or glass can now be utilised for superconducting purposes. The further processing of polymers is quite easy because of their good plastic and thermoplastic properties. Glasses can readily be spun into filaments and tapes after introduction and distribution of the superconducting particles. During the spinning process the incorporated superconducting particles are arranged in rows along the flow lines at very narrow spacings in the direction of the filament; this improves the superconducting properties additionally.

Additional features, advantages and applications of the invention are described in the following and illustrated by specific examples.

DETAILED DESCRIPTION OF THE PREFERRED EMBODIMENTS

A superconductor with technically advanced properties can be produced by admixing 30 volume percent NbN particles with mean diameter of 90 Å to 70 volume percent low-density polyethylene at temperatures of up to about 170° C. and distributing the particles uniformly by extended kneading or stirring. Adding wetting agents such as paraffin or fatty acids to the polymer or applying these agents to the particles enhances uniform distribution in the matrix. The resulting material can be extruded to strip. The strip has a transition temperature of 17 K, a critical magnetic field strength of about 350 kG, and a critical current density of $7 \times 10^4 \, A/cm^2$. If a higher thermal conductivity is required the strip can be coated with a metal, e.g. copper, on both sides.

Using superconducting $V_3Si$ particles makes it the to achieve transition temperatures of up to 27 K in this way.

Particularly uniform distribution of the superconducting particles in the polymer matrix can be achieved by introducing them into a polymer-solvent solution where upon the solvent is evaporated. A lacquer of this kind containing about 65 volume percent superconducting particles can be used for coating metallic and nonmetallic carriers with a superconductor. In this case it is of special advantage to deposit alternately a coat of lacquer with superconducting particles and a coat of lacquer with finely dispersed metal particles, e.g. silver powder. The resultant composite lacquer exhibits a significantly improved thermal conductivity. A dispersion of superconducting plus metal particles in the lacquer can also be used to advantage.

In the following it is described how a superconductor is prepared by providing a thin polyester strip with a lacquer coating of this kind. After the NbN particles have been added to the lacquer solution the latter is mixed in a ball mill together with phenolic and silicone resins for several hours. The filtered solution is then squeezed through slot dies and applied to the carrier as a thin film (12 $\mu m$). While the lacquer is dried in a drying tunnel in a dustfree atmosphere the solvent contained in the lacquer evaporates and the superconducting layer is cured. The final layer is about 6 $\mu m$ thick. At a volume content of NbN particles of about 55 percent (mean particle size 90 Å) incorporated in the lacquer coating the transition temperature achieved is 19 K, the critical current density related to the lacquer coating at 4.2 K $2 \times 10^5 \, A/cm^2$ and the upper critical magnetic field strength $H_{c2}$ about 700 kG.

Incorporating the same kind of NbN particles in a glass melt (30 vol. %) enables the following characteristics to be achieved after processing into fibers with a diameter of about 120 $\mu m$: transition temperature 18 K, critical current density $I_c \sim 10^5 \, A/cm^2$, upper critical magnetic field strength 370 kG.

To this end low-melting glasses are ground into powder and fractionated by sedimentation. A fraction with a particle size below 3 $\mu m$ is selected and intimately mixed with NbN particles with an average size of 90 Å in a ratio of about 70 to 30 volume percent. The mixture is subsequently filled into a ball mill together with a low-boiling liquid, e.g. a hydrocarbon such as benzene, and a small quantity of a wetting agent, e.g. a fatty acid or paraffin. Prior to this the ball mill was heated to a temperature near the boiling point of the low-boiling liquid. After a short mixing period the entire mixture becomes pasty. In this state the mixture is pressed into rods which are dried at a temperature below 700° C. The resulting sintered rods have only unsatisfactory superconducting properties. After drawing filaments from these rods at a temperature below 850° C. — this is a conventional method — opaque filaments with a diameter between 50 and 120 $\mu m$ were obtained. As expected, these had the superconducting properties described above.

It is also of advantage to deposit the superconducting particles on to or incorporate them into polymers which do not completely embrittle even at low temperatures, e.g. ethylene-vinyl acetate or ethylene-ethyl acrylate. The softening point of these polymers ranges between 65° and 95° C. They can be filled with a particularly high proportion of superconducting particles. Additional materials suitable for particle incorporation, are butadiene-based polymers.

I claim:

1. A method for the production of superconductors consisting of a polymer or glass matrix with incorporated finely dispersed superconducting particles, about 50 to 1000 Å in diameter, of intermetallic compounds of vanadium or niobium with the elements of aluminium, germanium, silicon, gallium or tin or of niobium nitride or niobium carbonitride, comprising the steps of: (a) converting the matrix material into a viscous state; and (b) admixing superconducting particles to this viscous matrix in such quantities that after solidification of the matrix material the incorporated particles are spaced at a mean distance of the order of 10 to 100 Å.

2. A method according to claim 1, wherein the matrix material is a polymer and the particles are suspended in a solvent for admixture to the viscous polymer.

3. A method according to claim 2, comprising the further steps of depositing the viscous polymer with the incorporated particles on a carrier, and causing it to solidify.

4. A method according to claim 3, comprising the further step of admixing additional metal particles to the viscous polymer with the incorporated particles.

5. A method according to claim 1 comprising the additional step of adding a wetting agent to enhance the uniform distribution of the particles in the matrix.

6. A method according to claim 1 wherein the matrix material is a plastic on the basis of an olefin polymer or a butadiene polymer.

7. A method according to claim 6 wherein the plastic is selected from the group consisting of polyethylene, ethylene-vinyl acetate, ethylene-ethyl acrylate, or a polyene such as trans-polyacetylene.

8. A method according to claim 3, comprising the step of depositing suspension of the superconducting particles on a carrier in the form of a lacquer.

9. A method according to claim 8, comprising the steps of alternating lacquer coatings with superconducting particles with lacquer coatings with metallic particles.

10. A method according to claim 8, wherein the lacquer coating contains suspended metallic particles in addition to the superconducting particles.

11. A method according to claim 8, wherein the lacquer coatings are continuously deposited on to a carrier film, e.g. a polyester film.

12. A method according to claim 5 wherein a fatty acid or paraffin is used as wetting agent.

13. A method for producing filaments, film or strip from a superconducting material comprising the steps of converting the matrix material with incorporated superconducting particles into a viscous state, and forming filaments, films or strip from this mass and subsequently solidified by cooling or drying processes.

14. A method according to claim 13, wherein the matrix material in powder form is intimately mixed with the superconducting particles, pressed and/or sintered before being processed into filaments, films or strip.

15. A method according to claim 13 wherein the matrix is converted into a viscous state by heating.

16. A method according to claim 13 wherein the matrix is converted into a viscous state by contacting with a solvent.

17. A method according to claim 13 wherein the filaments, film or strips are formed by spinning.

18. A method according to claim 13 wherein the filaments, films or strips are formed by drawing.

* * * * *